United States Patent
Xu et al.

(10) Patent No.: US 9,608,648 B2
(45) Date of Patent: Mar. 28, 2017

(54) WIDEBAND DIRECT MODULATION WITH TWO-POINT INJECTION IN DIGITAL PHASE LOCKED LOOPS

(71) Applicant: Innophase, Inc., Chicago, IL (US)

(72) Inventors: Yang Xu, Chicago, IL (US); Fa Dai, Auburn, AL (US); Dongyi Liao, Auburn, AL (US)

(73) Assignee: INNOPHASE, INC., San Diego, CA (US)

( * ) Notice: Subject to any disclaimer, the term of this patent is extended or adjusted under 35 U.S.C. 154(b) by 0 days.

(21) Appl. No.: 15/207,266

(22) Filed: Jul. 11, 2016

(65) Prior Publication Data

US 2016/0322980 A1 Nov. 3, 2016

Related U.S. Application Data

(63) Continuation of application No. 14/667,368, filed on Mar. 24, 2015, now Pat. No. 9,391,625.

(51) Int. Cl.

| H03L 7/06 | (2006.01) |
|---|---|
| H03L 7/099 | (2006.01) |
| H03B 5/12 | (2006.01) |
| H03C 3/09 | (2006.01) |

(52) U.S. Cl.
CPC ......... *H03L 7/0992* (2013.01); *H03B 5/1215* (2013.01); *H03B 5/1228* (2013.01); *H03B 5/1243* (2013.01); *H03C 3/095* (2013.01); *H03C 3/0925* (2013.01); *H03C 3/0941* (2013.01)

(58) Field of Classification Search
CPC ..... H03L 7/087; H03L 2207/50; H03L 7/095; H03L 7/107; H03L 7/18
USPC .................................................. 327/156–159
See application file for complete search history.

(56) References Cited

U.S. PATENT DOCUMENTS

| 3,813,610 | A | * | 5/1974 | Kimura | ................. H03L 7/1972 331/1 A |
|---|---|---|---|---|---|
| 6,075,410 | A | * | 6/2000 | Wildhagen | .......... H04L 27/2332 329/318 |

(Continued)

OTHER PUBLICATIONS

Vaucher et al., "A Family of Low-Power Truly Modular Programmable Dividers in Standard 0.35-um CMOS Technology", IEEE Journal of Solid-State Circuits, vol. 35, No. 7, Jul. 2000.*

*Primary Examiner* — Lincoln Donovan
*Assistant Examiner* — Diana J Cheng
(74) *Attorney, Agent, or Firm* — Invention Mine LLC

(57) ABSTRACT

A digitally controlled oscillator (DCO) modulation apparatus and method provides a wideband phase-modulated signal output. An exemplary modulator circuit uses an oscillator in a phase-locked loop. The circuit receives a wrapped-phase input signal, unwraps the wrapped-phase input signal to generate an unwrapped-phase signal, and differentiates the unwrapped-phase signal. The wrapped-phase input signal and the differentiated unwrapped-phase signal are both injected into a feedback loop of the modulator circuit. The feedback loop may include a multi-modulus frequency divider with a frequency divisor that is temporarily incremented or decremented to cancel out abrupt phase jumps associated with the wrapped-phase to unwrapped-phase conversion.

20 Claims, 11 Drawing Sheets

(56) References Cited

U.S. PATENT DOCUMENTS

| | | | | |
|---|---|---|---|---|
| 6,466,630 B1* | 10/2002 | Jensen | ............... | H03J 7/04 |
| | | | | 375/327 |
| 6,731,209 B2* | 5/2004 | Wadlow | ............ | G01D 5/24 |
| | | | | 324/686 |
| 7,123,665 B2* | 10/2006 | Brown | ........... | H03C 3/0925 |
| | | | | 332/126 |
| 7,123,666 B2* | 10/2006 | Brown | ......... | H04L 27/2017 |
| | | | | 332/126 |
| 7,127,020 B2* | 10/2006 | Brown | ......... | H04L 27/2017 |
| | | | | 332/123 |
| 8,994,423 B2* | 3/2015 | Jenkins | ............ | H03L 7/087 |
| | | | | 327/149 |
| 2008/0253481 A1* | 10/2008 | Rivkin | ............ | G01R 25/02 |
| | | | | 375/316 |
| 2009/0213980 A1* | 8/2009 | Ding | ............ | H03K 23/584 |
| | | | | 377/48 |

* cited by examiner

WIDEBAND DIRECT MODULATION WITH TWO-POINT INJECTION IN DIGITAL PHASE LOCKED LOOPS

CROSS-REFERENCE TO RELATED APPLICATIONS

This application is a Continuation of U.S. application Ser. No. 14/667,368, filed Mar. 24, 2015, entitled "WIDEBAND DIRECT MODULATION WITH TWO-POINT INJECTION IN DIGITAL PHASE LOCKED LOOPS", the contents of which is hereby incorporated in its entirety.

BACKGROUND OF THE INVENTION

The tuning input of a voltage controlled oscillator (VCO) has been used to generate a modulated transmit signal. However, when the VCO is included in a phase locked loop (PLL) configuration, the response of the PLL acts as a high pass filter, effectively removing low frequency components of the modulation signal. To eliminate this effect, singlepoint modulation schemes were developed that inject the modulating signal by either adjusting the VCO input or by adjusting a frequency divider ratio in the feedback loop. One limitation of such systems is that the bandwidth of the modulation is inherently limited by the bandwidth of the PLL feedback loop. Even with the addition of high-pass compensation schemes, the bandwidth available is limited to a few megahertz. Two-point modulation schemes were developed that inject the modulating signal at the controllers of both the VCO and the frequency divider in the feedback loop such that the high-pass characteristics at the VCO input is compensated by the low-pass characteristics at the divider control.

FIG. 1 is a prior art system 100 for providing a phase-modulated signal 102 processed by a differentiator 104 that is then applied to a digitally controlled oscillator (DCO) 106. The output of the DCO is applied to a loop filter 108 and combined at the input to the DCO 106. The output 110 is applied to an amplifier 112 to generate an amplified transmit signal 114.

FIG. 2A is a signal plot showing the frequency of an original phase modulated signal and the frequency of the signal after high-pass filtering. Although the frequency signals 202, 204 appear very close, the plots of FIG. 2B show that the phase 210 of the output signal differs significantly from the input phase 206. Initially, in the example waveform of FIG. 2B, the input phase 206 is greater than the output phase 210 until the waveforms cross approximately at point 208.

To compensate for the limitations of the single-point modulation, so-called "two-point" modulation schemes were developed to increase the available bandwidth that may be generated by the PLL/VCO modulator. As shown in FIG. 4, two-point systems typically operate by splitting the information signal into high-pass 402 and low-pass 404 components, where the high-pass component is used to direct-modulate the VCO, while the low pass component is used within the PLL loop to either adjust the phase detector output or to adjust a frequency divider ratio in the feedback loop. Modulation at these two points produces a composite signal 406 with a spectral response (as shown by the Power Spectral Density, or PSD) extending down to DC as shown in 408.

Some inherent challenges exist with two-point modulation, including synchronization of the high-pass and low-pass modulation components, matching the gains on the high-pass and low-pass modulation paths, as well as high power consumption resulting from high-rate PLL operations.

Accordingly, there is a need for improved wideband two-point modulators.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIGS. 12A-D are temporal plots illustrating techniques of generating a differentiated unwrapped-phase signal from a wrapped-phase input signal.

Figure 1:
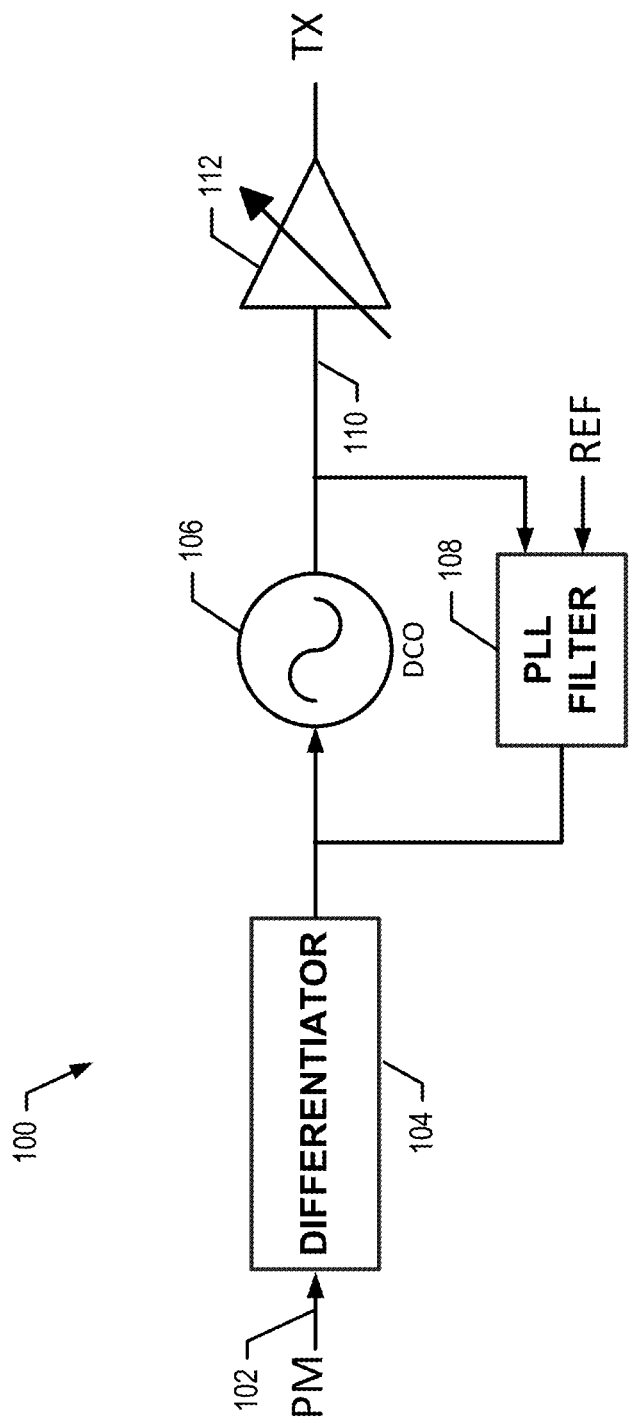
FIG. 1 is a block diagram of a prior art single point modulator.
Figure 2A:
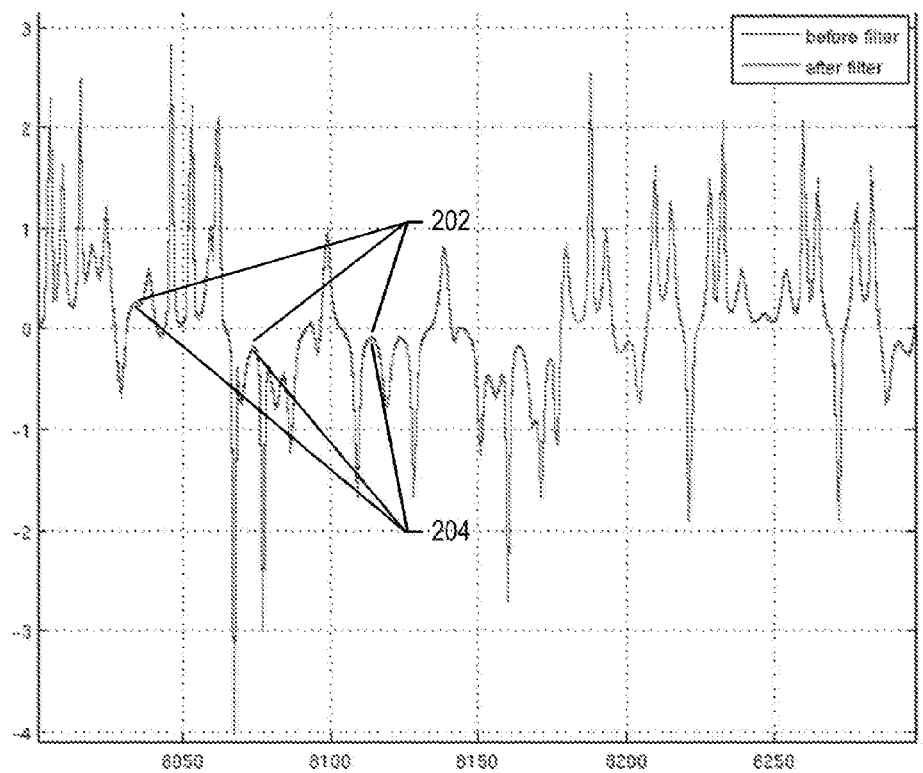
FIGS. 2A-2B are plots of prior art frequency and phase signals.
Figure 2B:
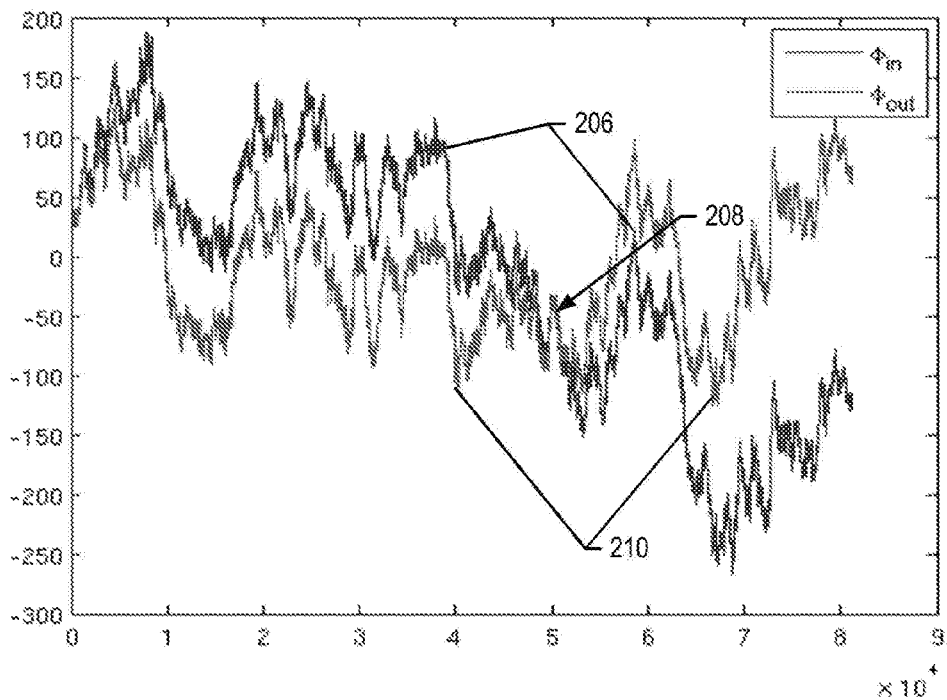
Figure 3:
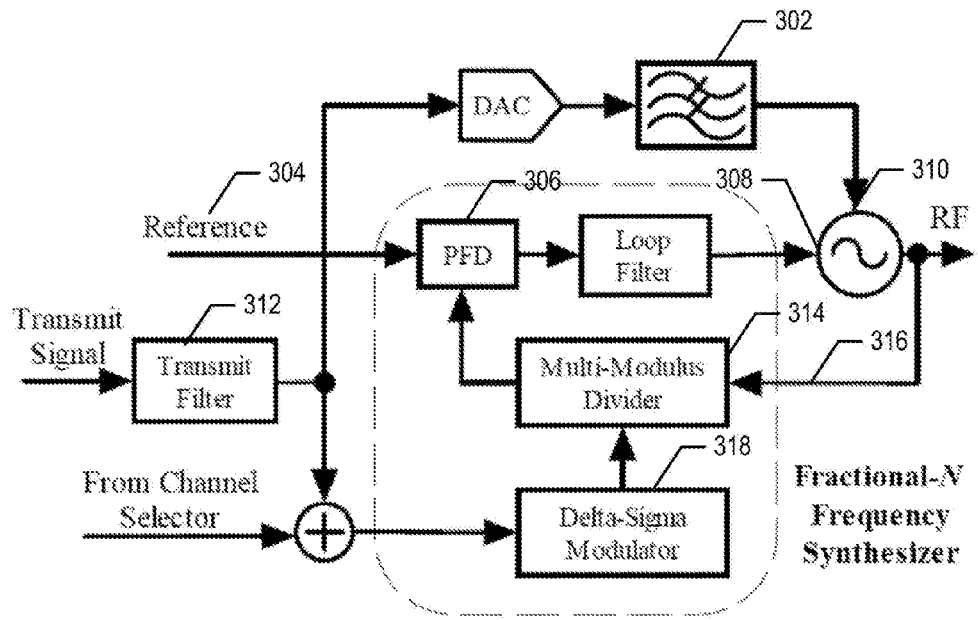
FIGS. 3 and 4 are prior art two-point modulation systems.
Figure 4:
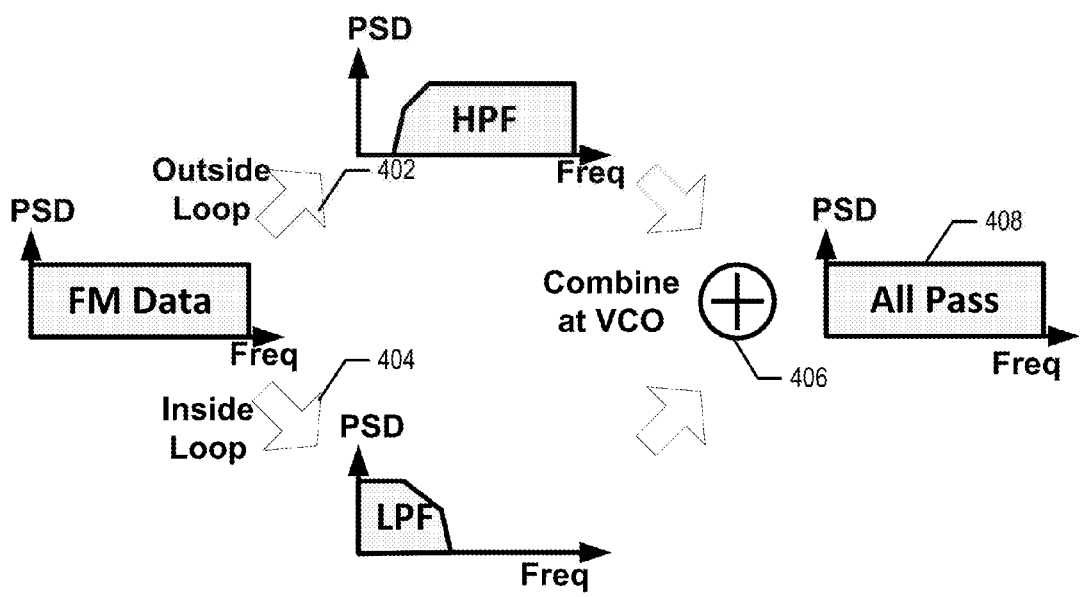

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Described herein is a two-point modulation apparatus and method that provides a wideband phase-modulated signal output. The modulator employs a phase-locked loop with injection of both a wrapped-phase input signal and a differentiated unwrapped-phase signal, with the differentiated unwrapped-phase signal providing a frequency domain representation of the input signal. The use of the unwrapped-phase signal provides for narrower FM bandwidth due to the absence of abrupt phase changes, which improves transmission characteristics while maintaining compliance with mask requirements.

Figure 5:
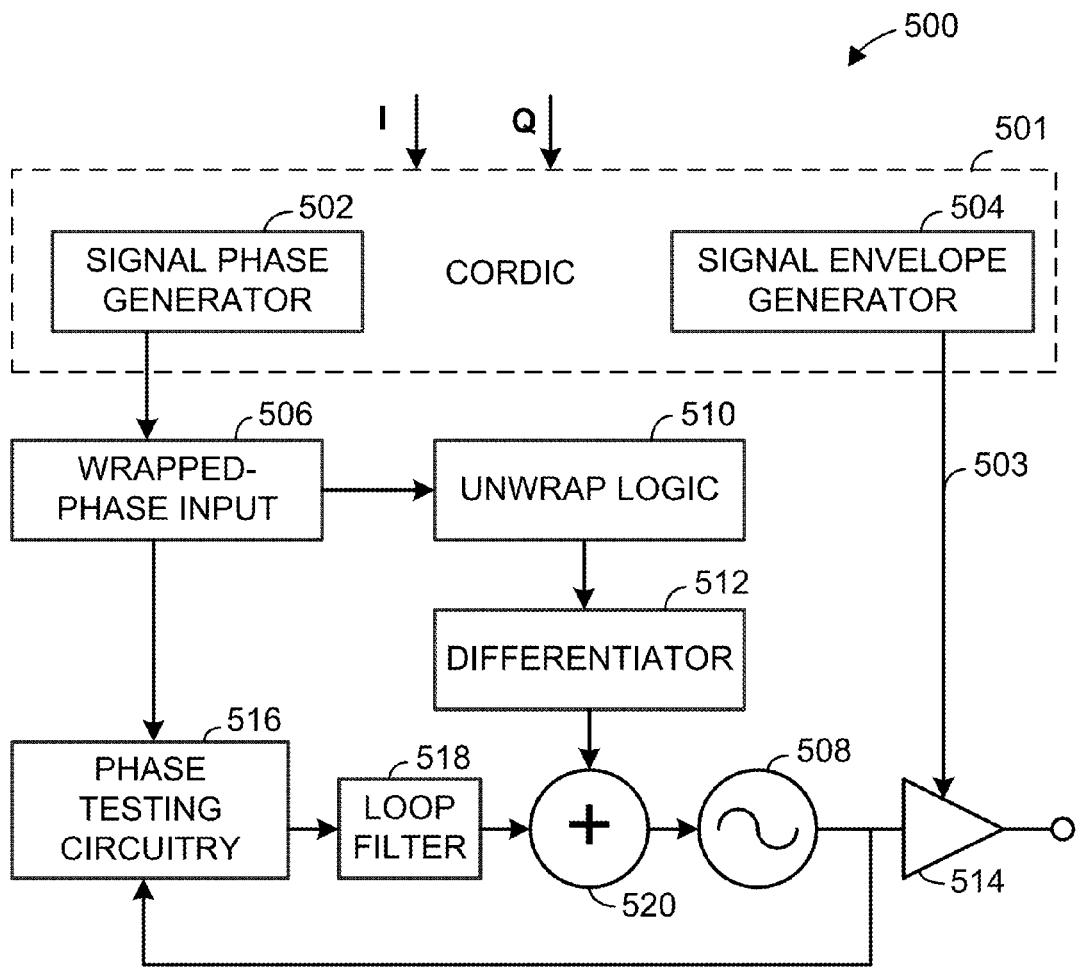
FIG. 5 is a block diagram of the two-point modulation system in accordance with some embodiments.

In an embodiment illustrated in FIG. 5, a direct modulation digital VCO circuit includes a signal phase generator 502 and a signal envelope generator 504. In some embodiments, the signal phase generator 502 and signal envelope generator 504 may be implemented with a CORDIC (COordiante Rotation DIgital Computer) Baseband inphase (I) signals and quadrature (Q) signals are applied at inputs to a signal phase generator 501. The signal phase generator may therefore be configured to process an inphase baseband signal and a quadrature baseband signal and perform a rectangular-to-polar conversion. In some embodiments, the signal phase generator is a CORDIC (COordiante Rotation DIgital Computer) calculator.

In some embodiments, the signal phase generator may be combined with a signal envelope generator configured to generate an envelope signal on output 503. The envelope signal corresponds to the envelope of a desired information-modulated transmit signal, such as the envelope formed by the magnitude of the baseband I/Q signals on inputs. The envelope signal may be digital in nature and be used to control a digitally switching amplifier, or may be analog and be used to control an analog power control input of an amplifier. Further, a digital envelope signal may be converted to an analog signal and applied to an analog power control input.

In the embodiment of FIG. 5, a phase-locked loop circuit has an input 506 for receiving a wrapped-phase input signal. The wrapped-phase input signal specifies the desired phase of a carrier signal generated by a voltage-controlled oscillator 508. The wrapped-phase input signal has a range that substantially spans $2\pi$, or one full cycle of the oscillator 508. It should be noted that the wrapped-phase input signal is not necessarily presented in the form of an angle (whether degrees or radians). Rather, the wrapped-phase input signal may be presented in the form of a time delay value, where the time delay values substantially span the period of one full cycle of the oscillator 508. A phase represented as a time delay can be expressed as an angle with reference to the period of the oscillator 508. For the sake of clarity, phase values are described herein in terms of angles, expressed in radians, with the understanding that different embodiments may encode the phase values in different ways.

The circuit 500 is provided with unwrap logic 510. The unwrap logic 510 converts the wrapped-phase input signal into an unwrapped-phase signal. The unwrapped-phase signal has a range of greater than $2\pi$. The unwrap logic operates to reduce substantial discontinuities that can appear in a wrapped-phase input signal. Consider an embodiment in which a wrapped-phase input can range from $-\pi$ to $+\pi$. There may be a situation in which the wrapped-phase input value makes a substantial step for example, from $+\pi$ down to $-\pi+\delta$, where $\delta$ itself is small. This substantial step of nearly $2\pi$ obscures the fact that, for small $\delta$, a signal with a phase offset of $+\pi$ is very similar to a signal with a phase of $-\pi+\delta$. (Indeed, a signal with a phase offset of $-\pi$ is the same as a signal with a phase offset of $+\pi$.) The unwrap logic thus converts the wrapped-phase input signal of $-\pi+\delta$ to an unwrapped-phase signal of $+\pi+\delta$, which is only slightly different from the prior phase offset of $+\pi$. The operation of the unwrap logic 510 is described in greater detail below with respect to FIGS. 6 and 7.

A differentiator 512 operates to take the time differential of the unwrapped-phase signal to generate a differentiated unwrapped-phase signal. The differentiator 512 may operate by subtracting a previous value of the unwrapped-phase signal from a current value of the unwrapped-phase signal. In some embodiments, the differentiator may be implemented by a two tap filter representing a simple difference equation, such as $y[n]=x[n]-x[n-1]$. In other embodiments, a differentiation filter with additional taps may be used. In some embodiments, the differentiation process is followed by multiplication of the differentiated unwrapped-phase signal by a constant value.

The oscillating signal generated by the oscillator 508 is provided as an input to an amplifier 514, which may be a digital power amplifier, which operates to amplify the signal. The gain of the amplifier 514 may be controlled by the signal envelope generator 504. The amplified oscillating signal may be transmitted wirelessly using an antenna, for example.

The oscillating signal generated by the oscillator 508 is also provided to phase testing circuitry 516. The phase testing circuitry 516 is operative to test the phase of the oscillating signal from the oscillator 508 against the phase signaled by the wrapped-phase input signal, and the phase testing circuitry 516 provides an error signal that represents the phase difference between the phase of the oscillating signal and the wrapped-phase input signal. The operation of exemplary phase testing circuitry is described in greater detail below with respect to FIG. 12.

The error signal generated by the phase testing circuitry 516 is provided to a loop filter 518. As described in greater detail above with respect to other embodiments, the loop filter 518 operates as a digital compensation filter to compensate for the high-pass characteristics of the phase-locked loop. In some embodiments, the loop filter 518 is a digital proportional-integral (PI) filter.

The filtered error signal from the loop filter 518 is combined with the differentiated unwrapped-phase signal by an adder 520 to generate a frequency control signal for the oscillator 508. In the exemplary embodiment of FIG. 5, the frequency control signal provided to the oscillator 508 has both a component based on the wrapped-phase input signal and a component based on the unwrapped-phase signal. Specifically, the error signal is based on the wrapped-phase input signal, while the phase differential signal (i.e., frequency signal) is based on the unwrapped-phase signal. The phase testing circuitry 516, loop filter 518, and adder 520 are elements of a feedback loop that, together with the controllable oscillator 508, form a phase-locked loop.

If the phase of the signal output by the oscillator 508 lags behind the phase indicated by the wrapped-phase input signal, then the resulting error signal, through its contribution to the frequency control signal, tends to cause the oscillator 1308 to oscillate at a higher frequency until the phases match more closely. Conversely, if the phase of the signal output by the oscillator 508 is in advance of the phase indicated by the wrapped-phase input signal, then the resulting error signal tends to cause the oscillator 508 to oscillate at a lower frequency until the phases match more closely. The unwrapped-phase signal also makes a contribution to the control signal. For example, a high positive value of the differentiated unwrapped-phase signal indicates that the frequency of the oscillator 508 should be increased.

In some embodiments, the unwrap logic 510 operates by adding a selected phase offset to the wrapped-phase input signal. The phase offset may be a positive phase offset, a negative phase offset, or phase offset of zero. The positive phase offset may be an offset of $+2\pi$, and the negative phase offset may be an offset of $-2\pi$. (Again, it should be noted that phase signals discussed herein need not be expressed in radians. For example, in some embodiments, phase signals can be represented as digital time values, which are convertible to radians or degrees as desired in the context of a baseline frequency value.) In some embodiments, the phase offset remains constant until the difference between consecutive wrapped-phase input signal values has an absolute value greater than $\pi$. In case of an upward change of greater than $\pi$, the unwrap logic switches the offset downward, e.g. from $+2\pi$ to zero, or from zero to $-2\pi$. Conversely, in case of a downward change of greater than $\pi$, the unwrap logic switches the offset upward, e.g. from $-2\pi$ to zero, or from zero to $+2\pi$.

Figure 6:
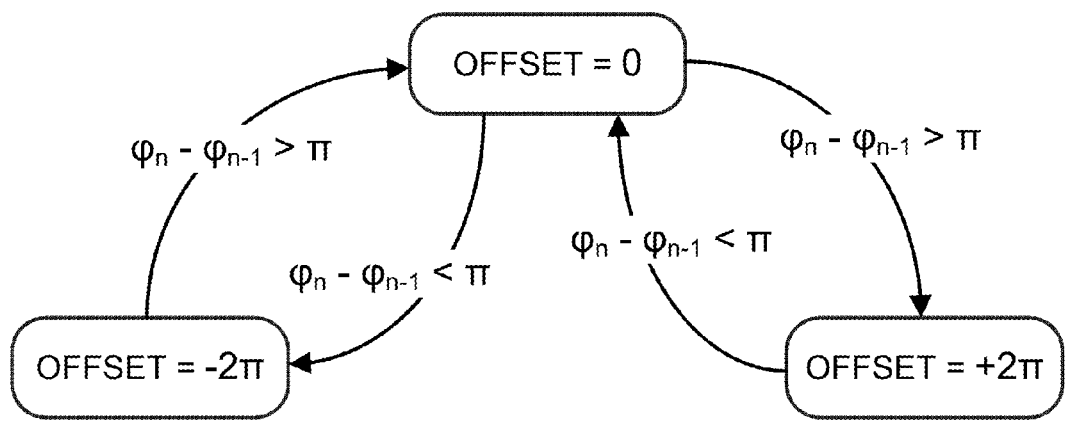
FIG. 6 is a state diagram of unwrap logic in some embodiments.

FIG. 6 is a state diagram illustrating the operation of the unwrap logic in some embodiments. Consider a wrapped-phase input signal provided as a sequence of digital values, $\phi_1, \phi_2 \ldots \phi_{n-1}, \phi_n$. The unwrap logic provides an unwrapped-phase signal that is the sum of the wrapped-phase output signal and an offset, where the value of the offset depends on the state of the unwrap logic. As illustrated in FIG. 6, when $\phi_n - \phi_{n-1} > \pi$, the state of the unwrap logic transitions to the right, and the offset transitions from $-2\pi$ to 0, or from 0 to $+2\pi$. When $\phi_n - \phi_{n-1} < \pi$, the state of the unwrap logic transitions to the left, and the offset transitions from $+2\pi$ to 0, or from 0 to $-2\pi$. In some embodiments, other states may be added with associated offset values. For example, the state diagram of FIG. 6 could be extended to accommodate states with offsets of $-4\pi$ and $+4\pi$.

Figure 7A:
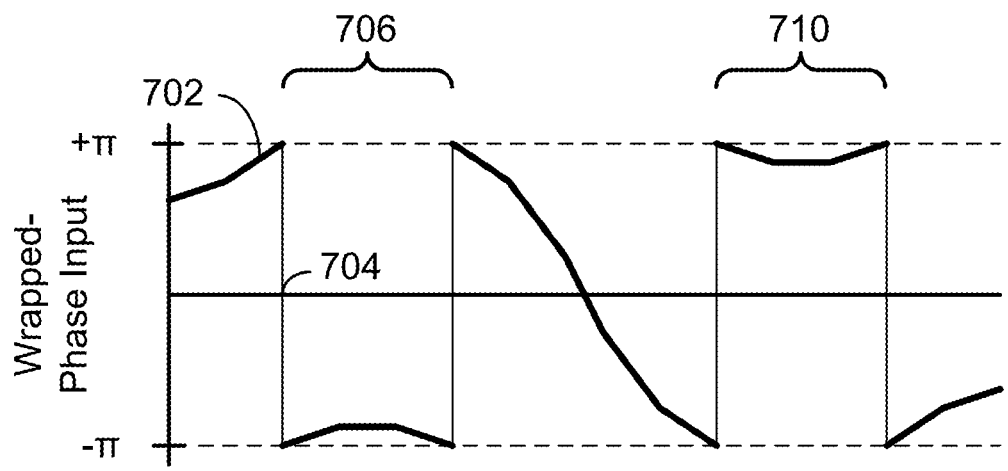
FIG. 7A-B are schematic plots of a wrapped-phase input and an unwrapped-phase signal.

The effect of unwrap logic 510 on a wrapped-phase input signal is described with reference to FIGS. 7A-B. FIG. 7A is a graph as a function of time of an exemplary wrapped-phase input signal with values that range from $-\pi$ to $+\pi$. The wrapped-phase input signal may be, for example, a signal output by a CORDIC as illustrated in FIG. 5. A steadily increasing phase signal 702 approaches $+\pi$ and wraps around to near $-\pi$. This amounts at time 704 to a large step of nearly $2\pi$ in the phase-wrapped input signal, even though a signal with a phase near $+\pi$ and a signal with a phase near $-\pi$ may be very similar.

Figure 7B:
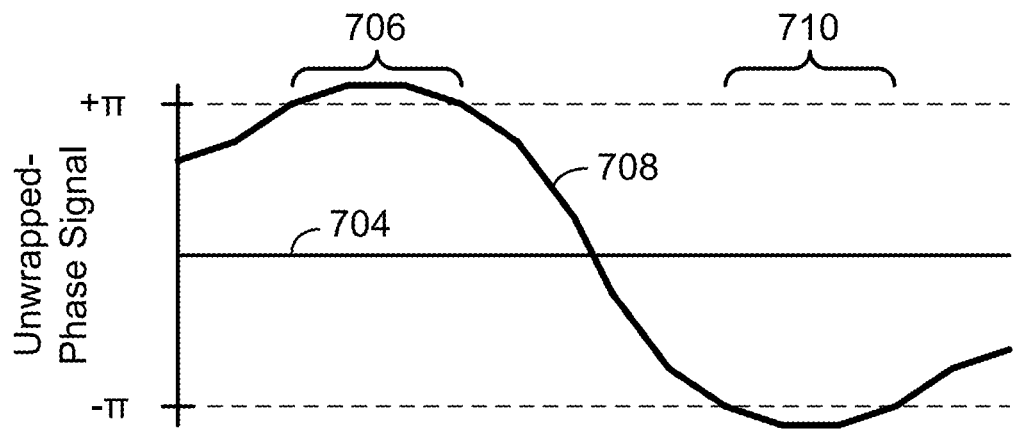

FIG. 7B is a graph, as a function of time, of an exemplary unwrapped-phase signal 708 generated by unwrap logic from the wrapped-phase input signal of FIG. 7A. Because the large downward step in the wrapped-phase input signal at time 704 is greater than $-\pi$, the offset used by the unwrap logic changes from zero to $+2\pi$. The offset value remains at $+2\pi$ through time period 706. At the end of time period 706, the value of the wrapped-phase input steps upward by more than $\pi$, and the offset used by the unwrap logic changes from $+2\pi$ back to zero. During the time period 706, the unwrap logic unwraps the wrapped-phase input signal by adding the offset of $+2\pi$, substantially eliminating the large jumps that were manifest in the wrapped-phase input signal 702. Similarly, the wrapped-phase input signal is unwrapped during time period 710 by adding an offset of $-2\pi$ to the wrapped-phase input signal.

Figure 8:
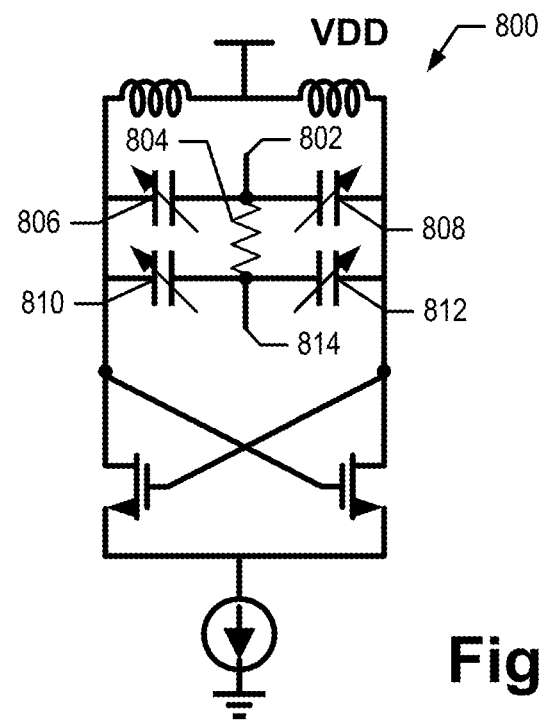
FIGS. 8-10 are circuit diagrams of a VCO or DCO having digital and/or analog inputs for controlling tank capacitances in accordance with some embodiments.
Figure 9:
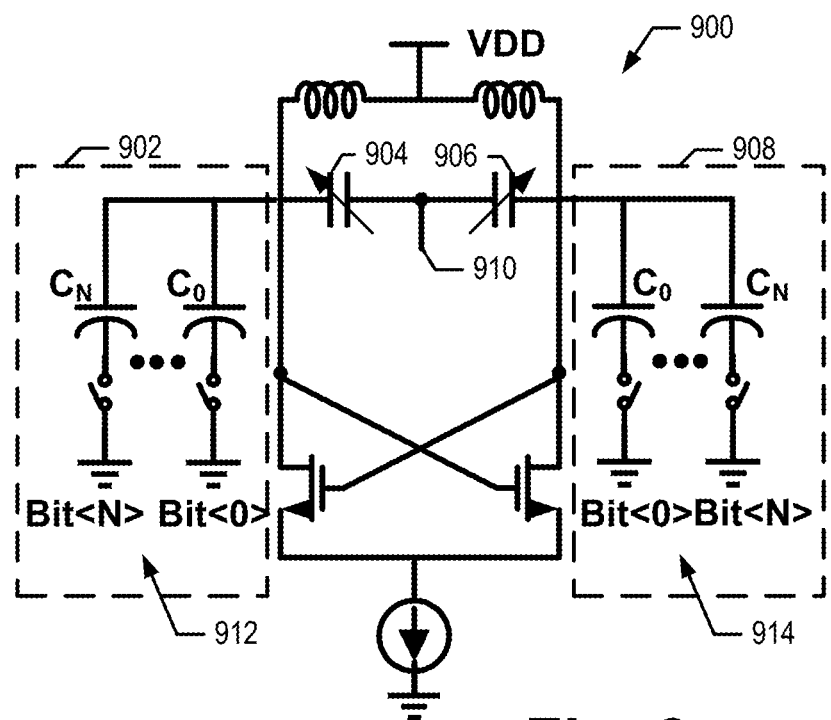
Figure 10:
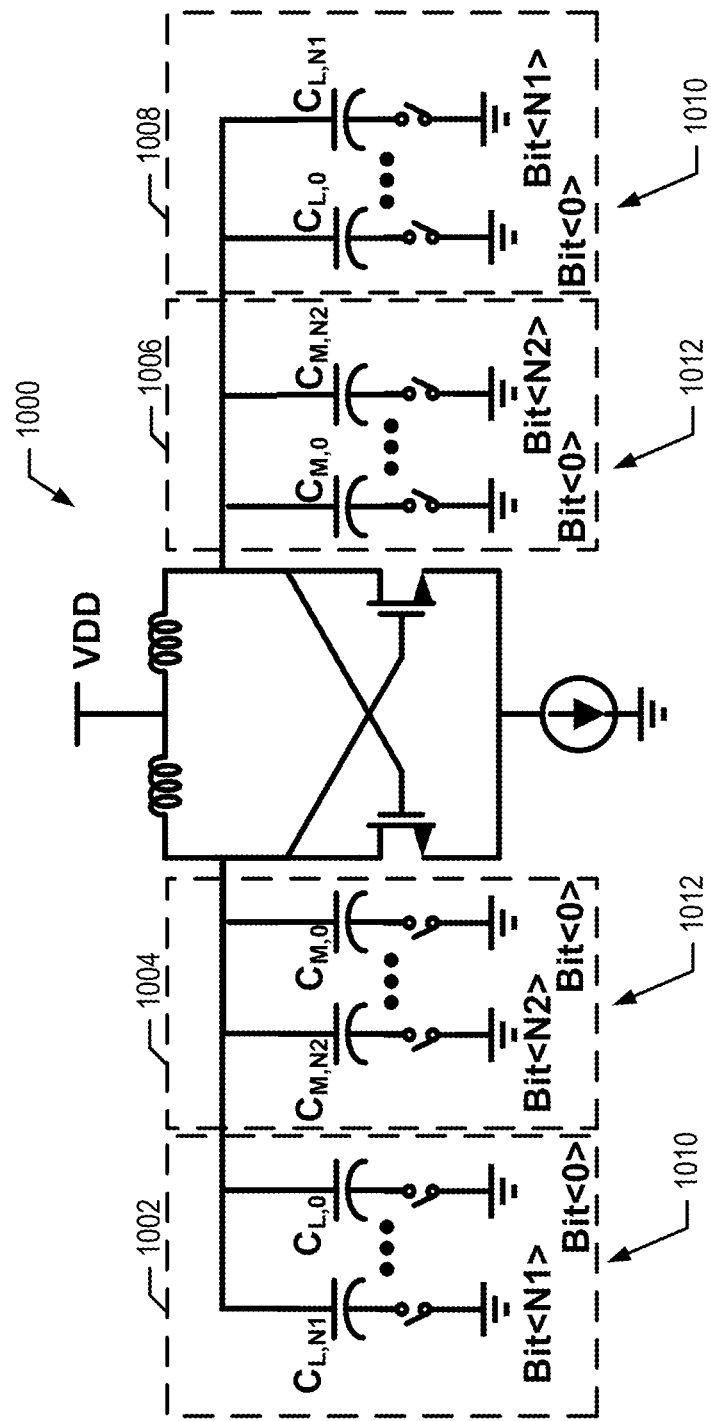

FIGS. 8-10 show various embodiments of DCO structures. With reference to FIG. 8, the DCO 800 includes a first VCO control input 802 having a variable capacitance provided by varactors 806, 808, and a second VCO control input 814 having a variable capacitance provided by varactors 810, 812. In some embodiments the two input nodes may be coupled via high impedance resistor 804, although other embodiments do not have a resistor in the tank circuit. In this embodiment, the capacitance may be varied by adjusting a analog voltages of the input signals applied to the input nodes 802, 814, based on the differentiated unwrapped phase and on the combined error and wrapped phase, respectively. The capacitance, in turn, affects the frequency of oscillation.

With respect to FIG. 9, VCO 900 includes a first VCO control input 910 having a variable capacitance provided by varactors 904, 906, and a second VCO control input 912, 914, having a variable capacitance provided by switched capacitor banks 902, 908. In this embodiment, N+1 bits (Bit<N> to Bit<0>) are applied to the gates of transistors within capacitor banks 902, 908 to selectively place capacitors in the circuit 900 to alter the capacitance.

With respect to FIG. 10, VCO 1000 includes a first VCO control input 1010 having a variable capacitance provided by switched capacitor banks 1002, 1008, and a second VCO control input 1012 having a variable capacitance provided by switched capacitor banks 1004, 1006. In this embodiment, N1+1 bits (Bit<N1> to Bit<0>) are applied to the gates of transistors within capacitor banks 1002, 1008 to selectively place capacitors in the circuit 1000 to alter the capacitance, and N2+1 bits (Bit<N2> to Bit<0>) are applied to the gates of transistors within capacitor banks 1004, 1006 to selectively place capacitors in the circuit 1000 to alter the capacitance. Thus, in this embodiment, the controller includes a digital filter, and the control signal is a digital signal applied to a first set of switchable capacitors via the VCO control input. The unwrapped phase derivative signal is a digital signal applied to a second set of switchable capacitors via the modulation VCO control input. In a further embodiment, the VCO has a single input in the form of binary control data to control the capacitor banks. That is, the output of the loop filter is added to the differentiated unwrapped phase signal, and the digital sum is applied to the VCO control inputs.

In some embodiments, VCO comprises a first variable capacitance connected to the PLL VCO control input and a second variable capacitance connected to the modulation VCO control input, wherein either or both of the first variable capacitance and the second variable capacitance may take the form of voltage-tuned varactors or switched capacitor banks.

In further embodiments, the variable capacitance may be controlled by a combined signal formed by an analog or digital combiner. The combiner may be configured to combine the loop error control signal (including the wrapped phase input signal) and the phase derivative signal and to apply the combined control signal to a single variable capacitance. The single variable capacitance may be varactors or a switched capacitor bank.

In some embodiments a digital-to-analog converter may be used to convert an output of the digital summer (or a digital PLL control signal or digital modulation control signal) to an analog control signal voltage and to apply the analog control signal to the variable capacitance.

In further embodiments, the DCO may include a first variable capacitance that is adjustable by a channel selector to allow selection of a particular communication channel frequency. The channel selector may be incorporated into a state machine, or may otherwise be embedded within a suitable processor used to implement the transmitter's medium access control (MAC) layer. In an embodiment of the two-point modulator for use in IEEE 802.11b, for example, the channel selector may select a capacitance value corresponding to a particular channel frequency, where there are thirteen channels having a 5 MHz separation. The PLL circuit then operates to keep the VCO centered on the desired carrier frequency. In addition, in some embodiments, as the VCO is tuned across the available channels, the $k_{VCO}$ of the data modulation input may vary according to the selected channel.

Figure 11:
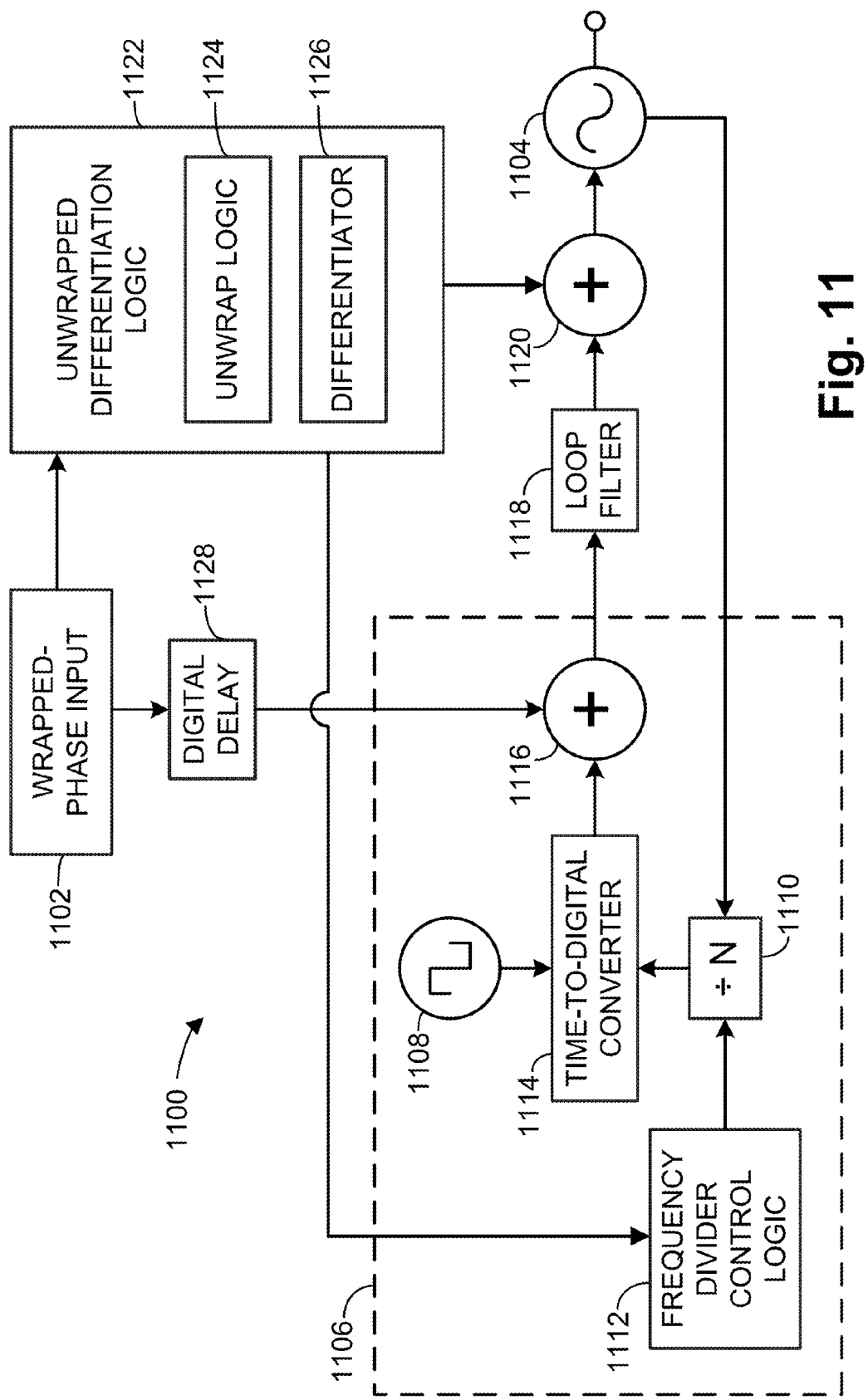
FIG. 11 is a schematic block diagram of a two-point modulator in a phase-locked loop according to some embodiments.

A phase-locked loop 1100 according to some embodiments is illustrated in FIG. 11. In the embodiment of FIG. 11, a wrapped-phase input 1102 is provided for receiving a wrapped-phase input signal. A digital voltage controlled oscillator 1104 provides an oscillating signal that is fed back to phase testing circuitry 1106. In the embodiment of FIG. 11, the phase testing circuitry 1106 includes a reference oscillator 1108, which provides a cyclic reference signal. In the embodiment of FIG. 11, the oscillator 1104 operates at a higher frequency than the frequency of the cyclic reference signal. Consequently, the phase testing circuitry 1106 employs a frequency divider 1110, which divides the frequency of the oscillating signal from the oscillator 1104 by a frequency divisor N to generate a frequency-divided signal. In some embodiments, the frequency divider 1110 is a multi-modulus frequency divider (MMD), with the frequency divisor N being controlled by frequency divider control logic 1112. A multi-modulus frequency divider may be implemented using, for example, a cascaded chain of ⅔ frequency divider sections. The divisor N may be an integer divisor or may be a fractional divisor. Incorporated herein by reference is the article "A Family of Low-Power Truly Modular Programmable Dividers in Standard 0.35-μm CMOS Technology" Vaucher et al., IEEE JOURNAL OF SOLID-STATE CIRCUITS, VOL. 35, NO. 7, JULY 2000, which describes programmable dividers that are suitable for use in various embodiments.

The phase testing circuitry 1106 is further provided with a time-to-digital converter (TDC) 1114, which is operative to compare the phase of the frequency-divided signal with the phase of the cyclic reference signal to generate a measured phase signal. The time-to-digital converter 1114 may operate by, for example, measuring an elapsed time between a rising edge of the cyclic reference signal and a rising edge of the frequency-divided signal.

The phase testing circuitry 1106 also includes summation logic 1616, which may be an adder operating on the wrapped-phase input signal. The summation logic 1116 operates to inject the wrapped-phase input signal into the feedback loop. The summation logic 1116 is operative to add the wrapped-phase input signal from the measured phase signal to generate an error signal. The error signal represents the difference between the phase of the oscillating signal from the oscillator 1104 and the wrapped-phase input signal. When the signal from the oscillator 1104 has a phase equal to the phase indicated by the wrapped-phase input signal, the error signal is substantially equal to zero. When the signal from the oscillator 1104 has a phase different from the phase indicated by the wrapped-phase input signal, the error signal provides a contribution to the control signal that controls the oscillator 1104, as discussed in further detail below.

The error signal generated by the phase testing circuitry 1106 is filtered by a loop filter 1118, which may be a digital proportional-integral (PI) filter, to generate a filtered error signal. An adder 1120 operates to add the filtered error signal with a differentiated unwrapped-phase signal generated by unwrapped differentiation logic 1122 to generate the control signal for the oscillator 1104. The adder operates to inject the differentiated unwrapped-phase signal into the feedback loop.

In some embodiments, the unwrapped differentiation logic includes unwrap logic 1124 followed by a differentiator 1126, analogous to the unwrap logic 510 and differentiator 512 of FIG. 5. However, the unwrapped differentiation logic may be implemented with alternative techniques.

Figure 12A:
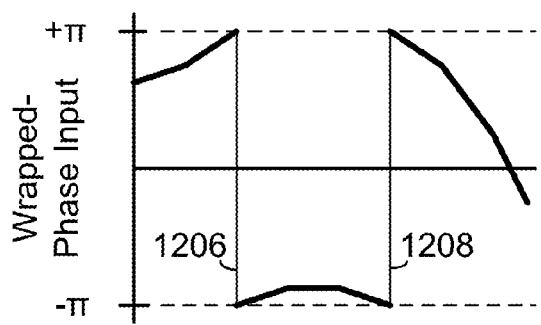
Figure 12C:
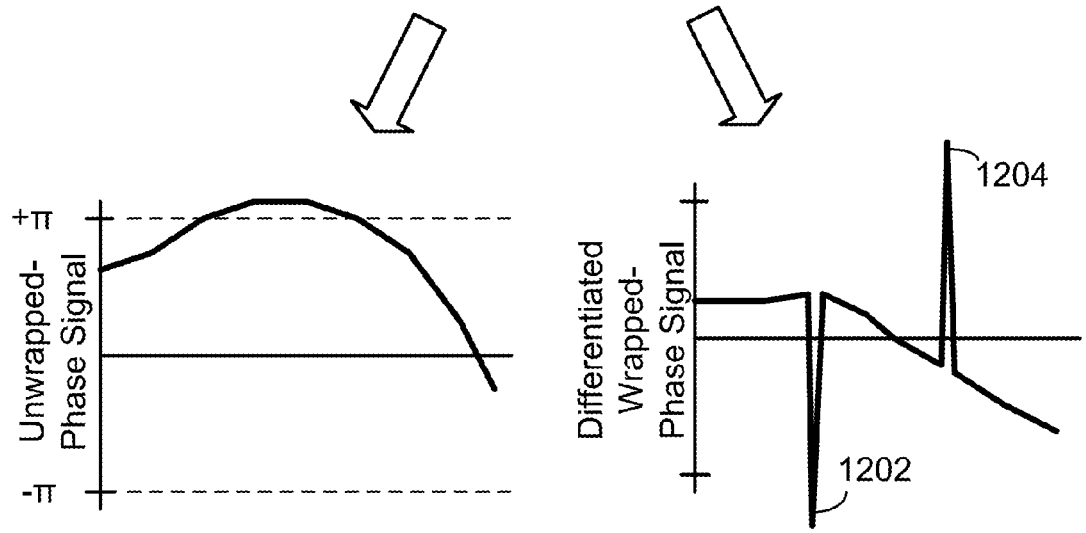
Figure 12C:
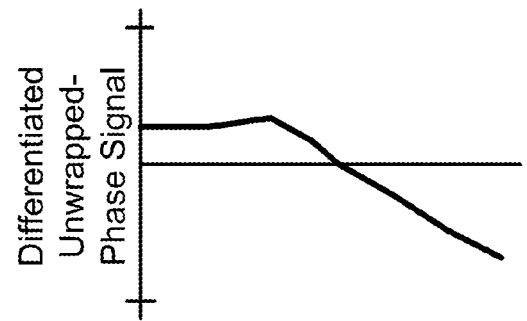

Alternative unwrapping techniques for use by unwrapped differentiation logic are illustrated in FIG. 12. FIG. 12A illustrates an exemplary wrapped-phase input signal. In some embodiments, unwrapped differentiation logic may first unwrap the wrapped-phase input signal, generating an unwrapped-phase signal as illustrated in FIG. 12B. By differentiating the unwrapped-phase signal of FIG. 12B, unwrapped differentiation logic generates a differentiated unwrapped-phase signal as illustrated in FIG. 12C. In other embodiments, the wrapped-phase input signal of FIG. 12A is differentiated, generating a differentiated wrapped-phase signal as illustrated in FIG. 12D. The differentiated wrapped-phase signal, however, has outlying values at 1202, 1204 that correspond respectively to jumps 1206, 1208 in the wrapped-phase input signal of FIG. 12A. The unwrapped differentiation logic can generate a differentiated unwrapped phase signal by adding a positive or negative offset to the differentiated wrapped-phase signal.

For example, in some embodiments, differentiation is performed by finding the difference between consecutive phase values. In such embodiments, the unwrapped differentiation logic may detect when a value of the differentiated phase-wrapped signal is greater than +π, and the logic may responsively add a negative offset of −2π to that value of the differentiated phase-wrapped signal. Conversely, the unwrapped differentiation logic may detect when a value of the differentiated phase-wrapped signal is less than −π, and the logic may responsively add a positive offset of +2π to that value of the differentiated phase-wrapped signal. This process results in a differentiated unwrapped-phase signal as illustrated in FIG. 17C that is identical to the differentiated unwrapped-phase signal obtained from FIG. 12B, which was obtained by performing unwrapping prior to differentiation.

As noted above, the phase-locked loop 1100 of FIG. 11 includes a multi-modulus frequency divider 1110 that divides the frequency of the signal from the oscillator 1104 by a variable divisor N. In some embodiments, this variable divisor N is controlled by frequency divider control logic 1112 so as to reduce the appearance of large steps in the error signal. In some embodiments, the frequency divider control logic 1112 operates to detect upward and downward steps of greater than π in the wrapped-phase input signal and to adjust the frequency divisor N for one cycle of divider circuit 1110 to count one more or one less cycle of DCO signal) to compensate for the step. Specifically, if a downward step of greater than −π is detected in the wrapped-phase input signal within the next N DCO cycles, then the frequency divisor N can be incremented by one (to N+1) so that the divider requires one additional cycle of the cyclic DCO signal before outputting a one, while if an upward step of greater than +π is detected in the wrapped-phase input signal within the next N DCO cycles, then the frequency divisor N can be decremented by one (to N−1) so that the divider outputs a one with one fewer cycle of the cyclic DCO signal. After one cycle of the divider 1110 that is in effect counting transitions of the cyclic reference signal, the frequency divisor is returned to its original value of N. The increment or decrement of the frequency divisor causes a step in the measured phase signal (the output of the time-to-digital converter 1114) that at least partially compensates for the step in the wrapped-phase input signal when those two signals are combined at the summation logic 1116.

In general, a step in the measured phase signal caused by the change in the frequency divisor N does not occur immediately upon a change in the frequency divisor. Thus, in some embodiments, a digital delay circuit 1128 is provided to delay the wrapped-phase input signal for a sufficient time such that the wrapped-phase input signal and the differentiated unwrapped-phase signal are aligned when they arrive at the input of the digitally controlled oscillator 1104.

Figure 13A:
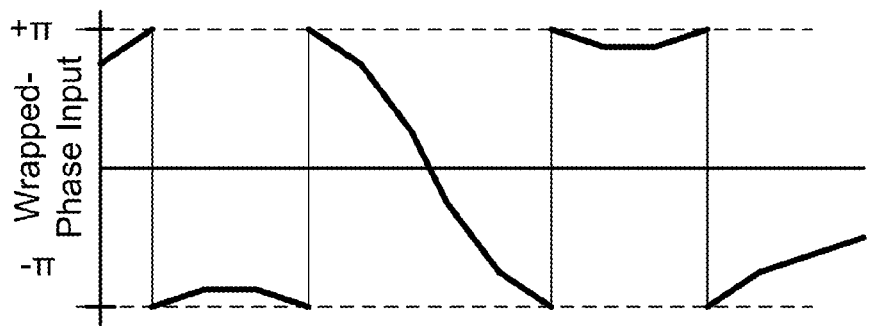
FIGS. 13A-D are transient plots of a wrapped-phase input signal, a delayed wrapped-phase input signal, a measured phase signal, and an error signal.
Figure 13B:
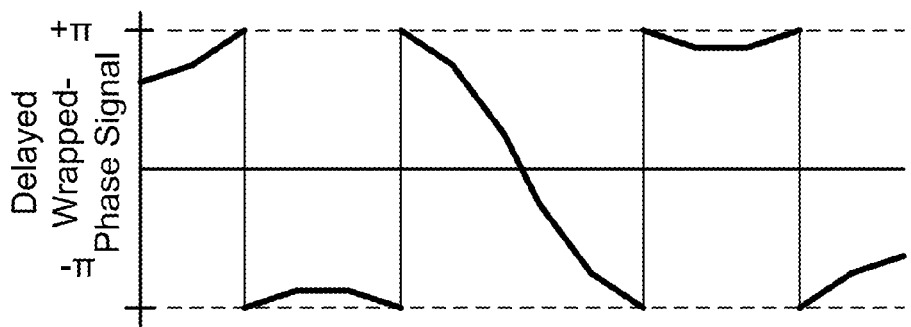
Figure 13C:
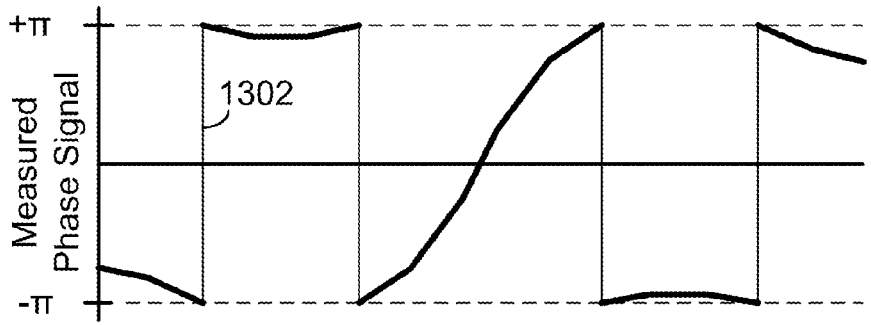

The effect of a temporary change in the frequency divisor N is illustrated in FIGS. 13A-D. FIG. 13A illustrates an exemplary wrapped-phase input signal. This signal may be delayed by the digital delay circuit 1128, resulting the exemplary delayed wrapped-phase input signal illustrated in FIG. 13B. FIG. 13C illustrates an exemplary measured phase signal generated by comparing the phase of the frequency-divided signal with the phase of the cyclic reference signal. Note that the TDC is configured to have negative gain corresponding to negative feedback. Large steps (such as step 1302) in the measured phase signal are generated when the frequency divisor N is temporarily incremented or decremented. The intentional insertion of these large steps in the measured error are intended to offset the phase jumps in the wrapped signal.

The effect of temporarily changing the frequency divisor can be understood as follows. When the frequency divider is dividing the frequency of the oscillating signal by N, there is one cycle of the frequency-divided signal for every N cycles of the oscillating signal. However, when the frequency divisor N is incremented to N+1, it takes one additional cycle of the oscillating signal to complete a cycle of the frequency-divided signal. The time-to-digital converter 1114 thus measures the frequency-divided signal as falling one cycle (of the oscillating signal) further behind, which corresponds to a phase shift of $-2\pi$. Conversely, when the frequency divisor N is decremented to N-1, it takes one fewer cycle of the oscillating signal to complete a period of the frequency-divided signal. The time-to-digital converter 1114 thus measures the frequency-divided signal as advancing by one cycle (of the oscillating signal), which corresponds to a phase shift of $+2\pi$.

Figure 13D:
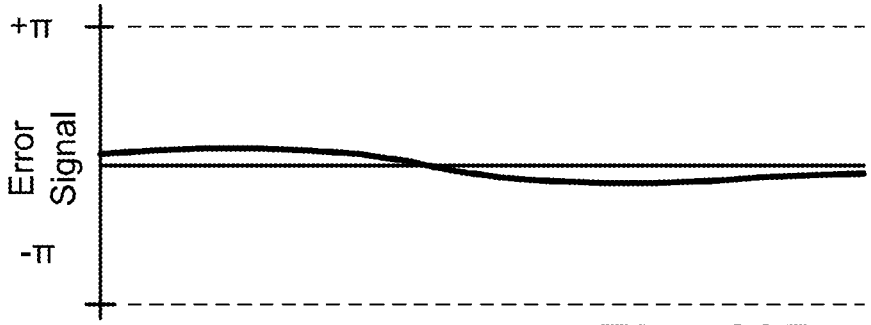

The summation logic 1116 operates to add the delayed phase-wrapped signal to the measured phase signal to generate the error signal. The effect of this combination is illustrated in FIG. 13D. As shown in the error signal of FIG. 13D, the large steps in the delayed wrapped-phase signal of FIG. 13B substantially cancel the large steps in the measured phase signal 1302, resulting in a smoother error signal. This, in turn, contributes to a cleaner power output spectrum.

The temporary change in the divisor N may be triggered in one or more of several different ways. For example, the frequency divider control logic 1112 may detect a step with an absolute value larger than $\pi$ in the wrapped-phase input signal by comparing successive values of the wrapped-phase input signal. Alternatively, the frequency divider control logic 1112 can detect when a change is made to the phase offset used by the unwrap logic and increment or decrement the frequency divisor accordingly. Specifically, the frequency divider control logic may be operative, upon detection that phase offset has increased, to increase the frequency divisor by one for one cycle of the reference signal, and upon detection that the phase offset has decreased, to decrease the frequency divisor by one for one cycle of the reference signal (or alternatively, one cycle of the divider circuit 1110).

Figure 14:
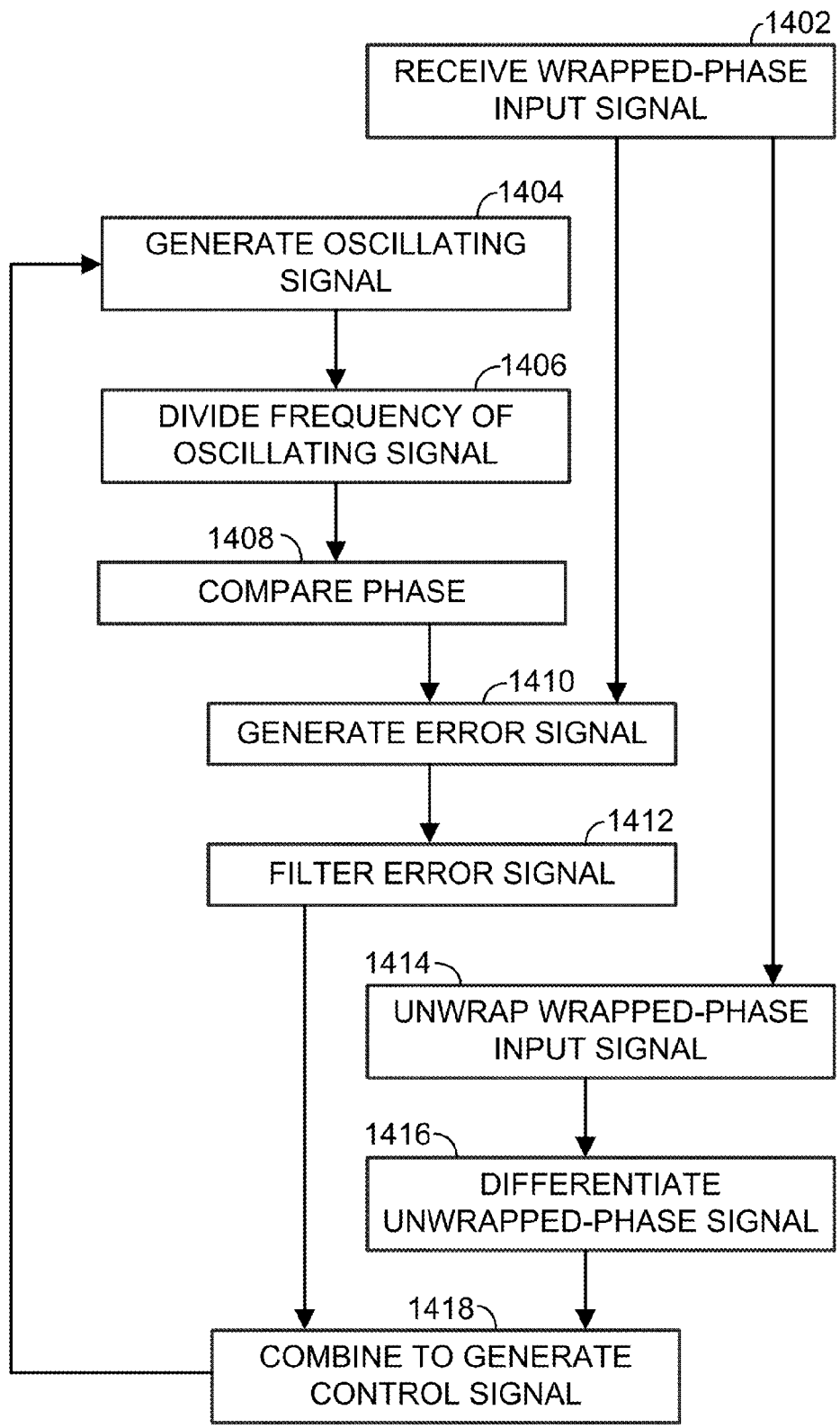
FIG. 14 is a flow diagram illustrating the operation of a phase-locked loop according to some embodiments.

A method performed by a phase-locked loop modulator in some embodiments is illustrated in FIG. 14. In step 1402, a modulator receives a wrapped-phase input signal while in step 1404, a controllable oscillator, such as a digitally controlled oscillator (DCO), generates an oscillating signal.

In step 1406, the frequency of the oscillating signal is divided by a frequency divisor to generate a frequency-divided signal.

In step 1408, the phase of the frequency-divided signal is compared with a phase of a cyclic reference signal to generate a measured phase signal. In step 1910, an error signal is generated by adding the wrapped-phase input signal to the measured phase signal. In step 1412, the error signal is filtered by a loop filter which may be, for example, a proportional-integral filter or other digital compensation filter.

In step 1414, the wrapped-phase input signal is unwrapped to generate an unwrapped-phase signal. The unwrapping may be performed by selecting a phase offset from the group consisting of a positive phase offset, a negative phase offset, and zero phase offset and adding the selected phase offset to the wrapped-phase input signal.

As described above, the frequency divisor used in the frequency-dividing step 1406 may be temporarily changed to accommodate the wrapping operation. For example, the modulator may detect a change in the phase offset. If a change in the phase offset is detected, the frequency divisor can be temporarily changed. For example, upon detection that phase offset has increased, the frequency divisor can be increased by one for one cycle of the reference signal. Conversely, upon detection that the phase offset has decreased, the frequency divisor can be decreased by one for one cycle of the reference signal. In some embodiments, the detection of a change in the phase offset is done by comparing the wrapped-phase input signal with the unwrapped-phase signal. In some embodiments, a delayed wrapped-phase input signal is generated, and the error signal is generated by determining the difference between the delayed wrapped-phase input signal and the measured phase signal. Other techniques for determining the frequency divisor may also be used. For example, the unwrap logic may be monitored to determine whether to delay or advance the output of the divider by one cycle.

In step 1416, the unwrapped-phase signal is differentiated to generate a differentiated unwrapped-phase signal. In some embodiments (as discussed above with respect to FIGS. 12A-D), the steps of unwrapping and differentiating may be performed in a different order or combined into an overall process of generating a differentiated unwrapped-phase signal from the wrapped-phase input signal.

In step 1418, a control signal is generated by combining the differentiated unwrapped-phase signal with the filtered error signal using, for example, an adder. This control signal in turn is fed back to the controllable oscillator. The wrapped-phase input signal, the unwrapped-phase signal, the error signal, and the control signal may all be digital signals.

The system described herein may use a class-D (or inverse Class-D) DPA. Such amplifiers may obtain higher efficiency than class-A, class-B or class-AB power amplifiers, for example, approximately 35% efficiency at 14 dBm output levels. Furthermore, systems utilizing the DCO as modulator do not require an I/Q modulator, thereby providing large savings in system power consumption and circuitry real estate.

In addition, it should be noted that the desired phase signal might have significantly greater bandwidth than the I/Q baseband signal. In general, the nonlinear transformation from rectangular (cardinal) coordinates of baseband I/Q to polar coordinates of magnitude and phase may result in a phase signal having a bandwidth, for example, five times greater than the original I/Q baseband signal. Thus, a 10

MHz (single sideband) I/Q baseband information signal may generate a 50 MHz phase signal. In this regard, the baseband I/Q data samples may be interpolated (such as by a factor of 5) prior to polar conversion to provide the necessary sampling rate to capture the phase information. In one embodiment, all sampled units in the DPLL operate at a clock frequency that is at least twice of the baseband BW in order to satisfy the Nyquist rule. For practical filtering, the clock frequency may be 3-4 times higher than the baseband bandwidth. to the system may operate at 40, 80 MHz or 160 MHz reference rate even if the modulation bandwidth is only 10-20 MHz)).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including", "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A circuit comprising:
  an oscillator circuit configured to receive a wrapped phase signal and a phase error signal at a modulation injection input and to generate responsively a modulated carrier signal;
  a phase error measurement circuit connected to an output of the oscillator circuit, configured to generate a phase error measurement signal;
  a loop filter configured to filter an error signal formed from the phase error measurement signal and the wrapped phase signal; and
  a frequency divider controller connected to the phase error measurement circuit, configured to inject responsively a phase jump in the phase error measurement signal to offset a phase jump in the wrapped-phase input signal.

2. The circuit of claim 1 further comprising a delay circuit to delay the wrapped-phase input signal to align with the phase error measurement signal.

3. The apparatus of claim 2, wherein the oscillator circuit comprises:
  unwrap logic configured to generate an unwrapped-phase signal from the wrapped-phase input signal;
  a differentiator connected to the unwrap logic to generate the differentiated unwrapped-phase signal;

addition logic configured to generate a frequency control signal by adding the phase error signal and the differentiated unwrapped-phase signal; and
an oscillator configured to generate the modulated carrier signal from the control signal.

4. The apparatus of claim 3, wherein the unwrap logic is operative:
to select a phase offset from the group consisting of a positive phase offset, a negative phase offset, and zero phase offset; and
to add the phase offset to the wrapped-phase input signal.

5. The apparatus of claim 3, wherein the wrapped-phase input signal, the unwrapped-phase signal, the error signal, and the control signal are digital signals.

6. The apparatus of claim 2, further comprising a signal phase generator configured to generate a phase signal of a desired information-modulated transmit signal, the signal phase generator being coupled to the wrapped-phase input.

7. The apparatus of claim 2, wherein the phase error measurement circuit comprises:
a frequency divider configured to divide the modulated carrier signal by a frequency divisor to generate a frequency-divided signal;
a reference oscillator configured to provide a cyclic reference signal;
a time-to-digital converter configured to compare a phase of the frequency-divided signal with a phase of a cyclic reference signal to generate the phase error measurement signal; and
addition logic configured to add the wrapped-phase input signal and the phase error measurement signal to generate the error signal.

8. The apparatus of claim 7, wherein the loop filter is a proportional-integral filter.

9. The apparatus of claim 7, further comprising:
a signal envelope generator configured to generate an envelope signal of a desired information-modulated transmit signal; and
an amplifier having:
a signal input connected to the oscillator output, and
a power control input configured to receive the envelope signal.

10. The apparatus of claim 1, wherein the frequency divider controller, in response to a step with an absolute value greater than $\pi$ in the wrapped-phase input signal, is operative to temporarily change the frequency divisor.

11. The apparatus of claim 10, wherein, the frequency divider controller is operative, upon detecting a downward step of more than $-\pi$ in the wrapped-phase input signal, to increase the frequency divisor by one, and upon detecting an upward step of more than $+\pi$ in the wrapped-phase input signal, to decrease the frequency divisor by one.

12. An apparatus comprising:
an oscillator circuit configured to receive a wrapped phase signal and a phase error signal at a modulation injection input and connected to a feedback loop;
a phase error measurement circuit connected to the feedback loop, configured to generate a phase error measurement signal;
a loop filter configured to filter an error signal formed from the phase error measurement signal and the wrapped phase signal; and
a frequency divider controller connected to the phase error measurement circuit, configured to inject responsively a phase jump in the phase error measurement signal to offset a phase jump in the wrapped-phase input signal.

13. The circuit of claim 12 further comprising a digital delay circuit to delay the wrapped-phase input signal to align with the phase error measurement signal.

14. The circuit of claim 12, wherein the phase jump has an absolute value of $2\pi$.

15. A method comprising:
receiving a wrapped phase signal and a phase error signal at a modulation injection input and generating responsively a modulated carrier signal;
generating a phase error measurement signal from the modulated carrier signal;
generating the phase error signal by filtering an error signal formed from the phase error measurement signal and the wrapped phase signal; and
injecting responsively a phase jump in the phase measurement error signal to offset a phase jump in the wrapped-phase input signal.

16. The method of claim 15, further comprising delaying the wrapped-phase input signal used in filtering the error signal.

17. The method of claim 15, wherein the error signal is filtered by a proportional-integral filter.

18. The method of claim 15, wherein generating a phase error measurement from the modulated carrier signal comprises:
dividing the modulated carrier signal by a frequency divisor to generate a frequency-divided signal;
comparing the phase of the frequency-divided signal with a phase of a cyclic reference signal to generate a measured phase signal; and
adding the wrapped-phase input signal to the measured phase signal to generate the error signal.

19. The method of claim 18, wherein injecting responsively a phase jump comprises:
increasing the frequency divisor by one for one cycle of the cyclic reference signal in response to detecting a downward step of more than $-\pi$ in the wrapped-phase input signal, and
decreasing the frequency divisor by one for one cycle of the cyclic reference signal, in response to detecting an upward step of more than $+\pi$ in the wrapped-phase input signal.

20. The method of claim 15, wherein generating responsively a modulated carrier signal comprises:
selecting a phase offset from the group consisting of a positive phase offset, a negative phase offset, and zero phase offset;
adding the phase offset to the wrapped-phase input to produce an unwrapped-phase signal;
generating a differentiated unwrapped-phase signal by taking a time differential of the unwrapped-phase signal;
adding the error signal to the differentiated unwrapped-phase signal.

* * * * *